(12) United States Patent
Zhang et al.

(10) Patent No.: US 11,239,848 B1
(45) Date of Patent: Feb. 1, 2022

(54) SYSTEMS AND METHODS FOR WIDEBAND SEGMENTED VOLTAGE CONTROLLED OSCILLATOR CALIBRATION

(71) Applicant: Chengdu Sicore Semiconductor Corp. Ltd., Chengdu (CN)

(72) Inventors: Cemin Zhang, Chino, CA (US); Xuanli Huang, Chengdu (CN)

(73) Assignee: Chengdu Sicore Semiconductor Corp. Ltd., Sichuan (CN)

( * ) Notice: Subject to any disclaimer, the term of this patent is extended or adjusted under 35 U.S.C. 154(b) by 0 days.

(21) Appl. No.: 17/315,304

(22) Filed: May 8, 2021

(30) Foreign Application Priority Data

Feb. 7, 2021 (CN) .......................... 202110174497.9

(51) Int. Cl.
| H03L 7/099 | (2006.01) |
| H03L 7/093 | (2006.01) |
| H03L 7/187 | (2006.01) |
| H03L 7/08 | (2006.01) |

(52) U.S. Cl.
CPC ................ *H03L 7/099* (2013.01); *H03L 7/08* (2013.01); *H03L 7/093* (2013.01); *H03L 7/187* (2013.01)

(58) Field of Classification Search
CPC . H03L 7/08; H03L 7/099; H03L 7/187; H03L 7/093

USPC .......................................... 331/44, 179, 167
See application file for complete search history.

(56) References Cited

U.S. PATENT DOCUMENTS

| 8,508,308 | B2* | 8/2013 | Dong | H03L 7/08 331/179 |
| 9,515,666 | B2* | 12/2016 | Pavao-Moreira | H03L 7/099 |
| 10,715,158 | B1* | 7/2020 | Joshi | H03L 7/187 |

* cited by examiner

*Primary Examiner* — Arnold M Kinkead
(74) *Attorney, Agent, or Firm* — North Weber & Baugh LLP; Michael V. North

(57) ABSTRACT

Various embodiments of the invention relate to calibrate a wideband segmented Voltage Controlled Oscillator (VCO). Upon initial calibration, information of frequency spanning ranges of each segment in the VCO may be saved into a memory. When the VCO is used or activated, a microcontroller reads data from the memory and applied selected information accordingly. The initial calibration involves a frequency sweep process beginning from a first segment with an initial frequency and records any lock detection (LD) signal to the MCU when a frequency/phase lock is engaged from an unlock status or interrupted from a lock status. With the LD signals, frequency bands of the segments may be calibrated, adjusted for temperature compensated, and finalized after associating adjacent segment frequency overlap zone. A frequency band for a segment may be further segmented into multiple sub-bands with corresponding charge pump currents designated respectively for improved phase lock loop phase noise performance.

20 Claims, 9 Drawing Sheets

| Logic Control State | | | | Output Band |
|---|---|---|---|---|
| S3 | S2 | S1 | S0 | |
| 0 | 0 | 0 | 1 | Band 1 |
| 0 | 1 | 0 | 1 | Band 2 |
| 0 | 0 | 1 | 0 | Band 3 |
| 1 | 0 | 0 | 1 | Band 4 |
| 1 | 0 | 1 | 1 | Band 5 |
| 1 | 0 | 0 | 0 | Band 6 |
| 1 | 0 | 1 | 0 | Band 7 |
| 1 | 1 | 0 | 0 | Band 8 |
| 1 | 1 | 1 | 0 | Band 9 |

FIG. 2
Prior Art

SYSTEMS AND METHODS FOR WIDEBAND SEGMENTED VOLTAGE CONTROLLED OSCILLATOR CALIBRATION

CROSS-REFERENCE TO RELATED APPLICATIONS

This application claims foreign priority to Chinese Patent Application No. 202110174497.9, entitled "SYSTEMS AND METHODS FOR WIDEBAND SEGMENTED VOLTAGE CONTROLLED OSCILLATOR CALIBRATION", naming Cemin Zhang and Xuanli Huang as inventors, and filed Feb. 7, 2021, the subject matter of which is hereby incorporated herein by reference.

BACKGROUND

A. Technical Field

The present invention relates generally to a voltage controlled oscillator (VCO), and more particularly to systems and methods to calibrate a wideband segmented VCO.

B. Background of the Invention

A VCO is an electronic oscillator with oscillation frequency controlled by an input voltage. The applied input voltage determines the instantaneous oscillation frequency. A VCO may be used for various applications, e.g. frequency modulation (FM), phase modulation (PM), a phase-locked loop, etc.

To achieve a wideband output, a VCO may adopt a segmented structure to incorporate multiple segments having various frequency tuning bands or sub ranges. Those multiple bands typically have frequency overlaps such that the overall tuning range has no void zones.

However, at those overlapped frequency bands, the different segments may have some variations in performance. The VCO may need to be initialized or calibrated, especially when the VCO is used in a phase lock loop (PLL) circuit, such that the VCO has consistent performance across the entire frequency band without interruption.

Accordingly, there is a need for systems and methods to calibrate a segmented VCO.

SUMMARY OF THE INVENTION

Described herein are system and method embodiments to calibrate a wideband segmented VCO.

When a wideband segmented VCO is used in a PLL, the frequency spanning range of each segment in the segmented VCO needs to be specified. However, due to manufacturing variations, an initial calibration may be necessary for each VCO to precisely determine a frequency spanning range of each segment in the VCO such that the VCO will not cause a PLL lock interruption at various operation temperatures.

The initial calibration may only need to be done one-time. Upon initial calibration, information of frequency spanning ranges of each segment in the VCO may be saved into a non-volatile memory, e.g., a ROM, accessible by a microcontroller unit (MCU). When the VCO is used or activated, the MCU reads data from the ROM and applied selected data accordingly.

In one or more embodiments, a designed output frequency range of the wideband segmented VCO is known before the initial calibration. A MCU sweep control signal is configured to frequency sweep from a first initial frequency below a lower bound of the designed output frequency range. The frequency sweep process begins from a first segment with the lowest frequency band among all segments in the VCO. In one or more embodiments, the first initial frequency may be chosen with a predetermined margin (e.g., 10% below the lower bound of the designed output frequency range) to ensure that the PLL is in an unlock status at the initial frequency. In one or more embodiments, during the frequency sweep process, the MCU is consistently monitoring the lock/unlock status of the PLL through a lock detection (LD) signal generated from a phase frequency detector of the PLL. For example, the LD signal may output logic 0 (or logic 1) during the PLL unlock (or lock) status. Thus, the LD signal output changes when a frequency/phase lock is engaged from an unlock status or a frequency/phase lock is interrupted from a lock status.

As frequency sweeping process goes to an actual lower frequency end of the first segment, the PLL starts to engage a frequency/phase lock and the phase frequency detector sends such a LD signal (frequency/phase lock engaged) to the MCU such that the MCU may save the actual lower frequency end of the first segment into an ROM for data recording. As frequency sweeping process goes to an actual upper frequency end of the first segment, the PLL has a lock interruption and the phase frequency detector sends such a LD signal (frequency/phase lock interrupted) to the MCU such that the MCU may save the actual upper frequency end of the first segment into an ROM for data recording.

Afterwards, the MCU sweep control signal is configured to frequency sweep from a second initial frequency below the actual upper frequency end of the first segment and the control I/O module selects a second segment, which outputs the second lowest frequency band among all segments in the VCO, to start. In one or more embodiments, the second initial frequency may be chosen with a predetermined margin to ensure that the PLL is in an unlock status at the second initial frequency for the second segment. As frequency sweeping process goes to an actual lower frequency end of the second segment, the PLL starts to engage frequency/phase lock and the phase frequency detector sends such a LD signal (frequency/phase lock engaged) to the MCU such that the MCU may save the actual lower frequency end of the second segment into an ROM for data recording. As frequency sweeping process goes to an actual upper frequency end of the second segment, the PLL has a lock interruption and the phase frequency detector sends such a LD signal (frequency/phase lock interrupted) to the MCU such that the MCU may save the actual upper frequency end of the second segment into an ROM for data recording.

The above frequency sweeping process continues until the MCU may save the actual upper frequency end of the last segment into an ROM for data recording. During a frequency sweeping process for each segment, the frequency sweep step may be a linear step or a variable step with balance of sweep precision and sweep efficiency.

In one or more embodiments, the calibrated frequency band for each segment may need to be adjusted for temperature compensation such that the adjusted frequency band for each segment is valid for any VCO operation temperature. When a VCO output with a specific frequency is desired, the MCU selects a corresponding segment according to the aforementioned adjusted frequency band for each segment. If specific frequency is within a frequency overlap zone of two adjacent segments, the MCU selects one segment, between the two adjacent segments, having a higher control voltage Vt corresponding to the specific frequency such that there is only one final selection of segment for the specific frequency.

In one or more embodiments, upon selection of a band (a segment), the MCU further selects a corresponding sub-band within the selected segment and controls the PLL to apply a charge pump current associated with the selected corresponding sub-band for desirable PLL loop phase noise performance.

In one or more embodiments, the MCU may be replaced with a digital signal processor (DSP), a field programmable gate array (FPGA), or an application-specific integrated circuit (ASIC).

In one or more embodiments, the ROM may be formed by electrically programmable fuse (eFUSE) and integrated together within a segmented VCO. The eFUSE type ROM is programmed after a first calibration of the segmented VCO.

One skilled in the art shall recognize that embodiments disclosed in this invention document may be implemented with various permutations, enhancements, equivalents, combinations, and improvements, all of which should fall within the scope of the present invention.

BRIEF DESCRIPTION OF THE DRAWINGS

Reference will be made to exemplary embodiments of the present invention that are illustrated in the accompanying figures. Those figures are intended to be illustrative, rather than limiting. Although the present invention is generally described in the context of those embodiments, it is not intended by so doing to limit the scope of the present invention to the particular features of the embodiments depicted and described.

Figure ("FIG.") 1 depicts output frequencies from multiple segments in a segmented VCO.

FIG. 2 depicts control logic of selecting one of the multiple segments in a segmented VCO.

DETAILED DESCRIPTION OF THE PREFERRED EMBODIMENTS

In the following description, for purpose of explanation, specific details are set forth in order to provide an understanding of the present invention. The present invention may, however, be practiced without some or all of these details. The embodiments of the present invention described below may be incorporated into a number of different electrical components, circuits, devices, and systems. Structures and devices shown in block diagram are illustrative of exemplary embodiments of the present invention and are not to be used as a pretext by which to obscure broad teachings of the present invention. Connections between components within the figures are not intended to be limited to direct connections. Rather, connections between components may be modified, re-formatted, or otherwise changed by intermediary components.

When the specification makes reference to "one embodiment" or to "an embodiment" it is intended mean that a particular feature, structure, characteristic, or function described in connection with the embodiment being discussed is included in at least one contemplated embodiment of the present invention. Thus, the appearance of the phrase, "in one embodiment," in different places in the specification does not constitute a plurality of references to a single embodiment of the present invention.

Components, or modules, shown in diagrams are illustrative of exemplary embodiments of the disclosure and are meant to avoid obscuring the disclosure. It shall also be understood that throughout this discussion that components may be described as separate functional units, which may comprise sub-units, but those skilled in the art will recognize that various components, or portions thereof, may be divided into separate components or may be integrated together, including, for example, being in a single system or component. It should be noted that functions or operations discussed herein may be implemented as components. Components may be implemented in software, hardware, or a combination thereof.

Various embodiments of the invention are related to calibrate a wideband segmented VCO. The wideband VCO may comprise multiple segments with each segment corresponding to a frequency tuning band. Each frequency tuning band corresponds to a subrange of the overall frequency band of the VCO. Those multiple bands typically have frequency overlaps such that the overall tuning range has no void zones. For performance consistency across the entire frequency band, the VCO needs to be initialized or calibrated.

Figure 1:
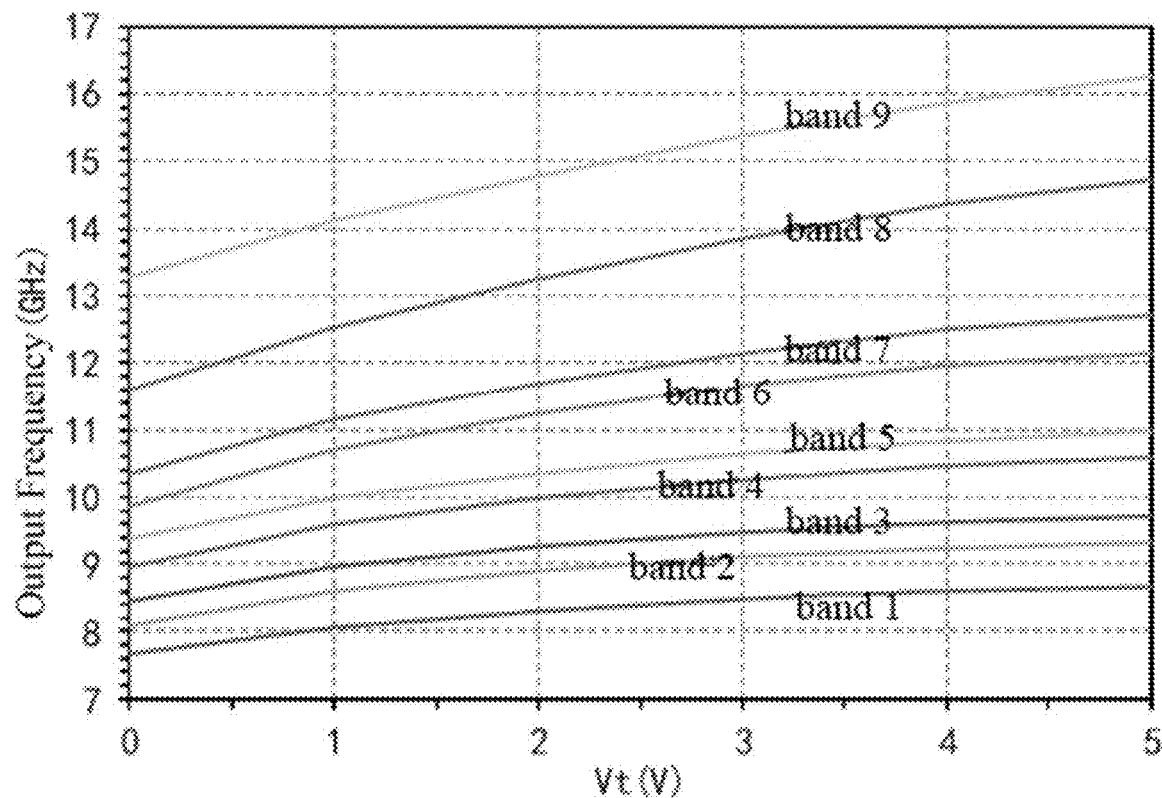

FIG. 1 depicts output frequencies from multiple segments in a segmented VCO. As shown in FIG. 1, there are 9 segments with each segment corresponding to a band under the VCO control voltage $V_t$. Adjacent bands have enough frequency overlap (e.g., >5% relative bandwidth, with relative bandwidth defined as the ratio of frequency bandwidth to center frequency of the frequency overlap zone) to ensure that the segmented VCO has no void zone over the overall frequency tuning range in different operation temperatures. A wideband segmented VCO may have a comparable phase noise to a single-band VCO.

FIG. 2 depicts control logic of selecting one of the multiple segments in a segmented VCO. The selection of one of the multiple segments may be implemented by four logic bits $S_0 \sim S_3$. With a combination of logic levels of these four bits, a user may chose a desired segment as the operating segment of the VCO. For example, when the four bits $S_0 S_1 S_2 S_3$ have a "1000" logic combination, segment 1 is selected as the operating segment for the VCO.

Figure 3:
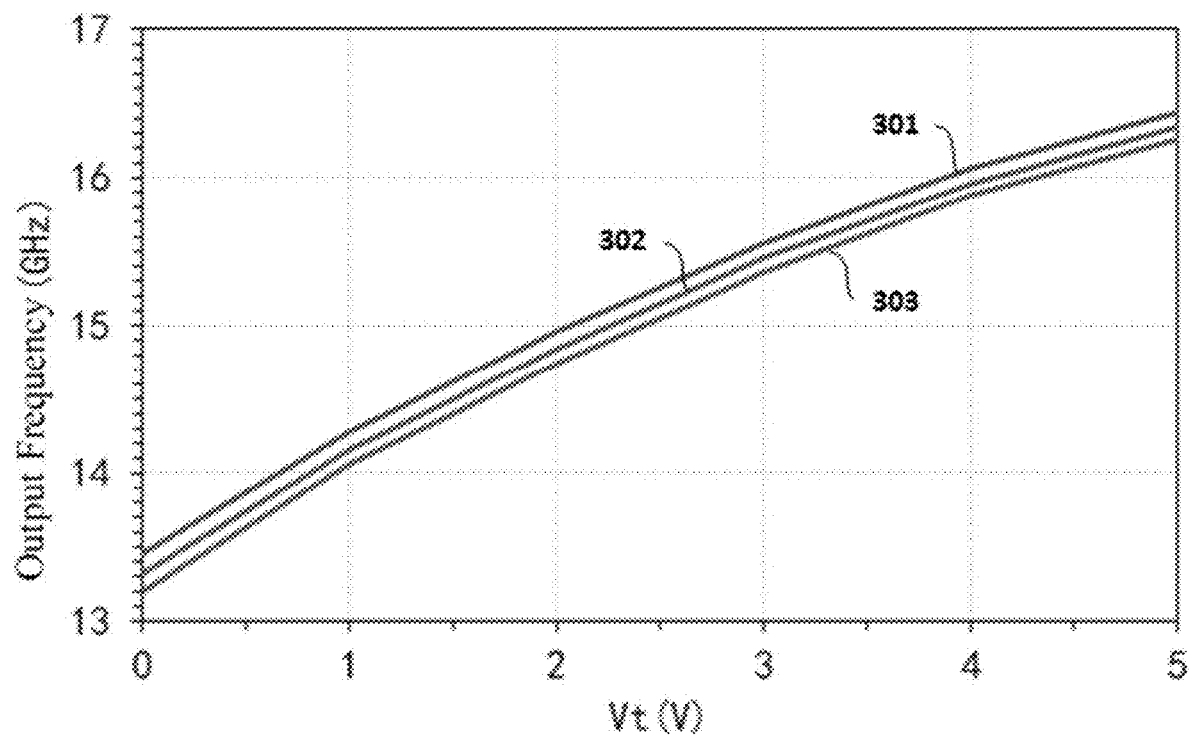
FIG. 3 depicts variations of output frequency from different segmented VCOs.

Due to inevitable variation during the manufacturing process, different wideband segmented VCOs, even under the same design parameter, may have performance variation in some segments. FIG. 3 depicts variations of output frequency from different segmented VCOs with the same model number under a same control condition. As shown in FIG. 3, under the same control voltage $V_t$, three VCOs, 301, 302, and 303, have small variations in the output frequencies.

When a segmented wideband VCO is used in a PLL, the frequency spanning range of each segment in the VCO needs to be specified. However, due to the variations shown in FIG. 3, the overall frequency of the segmented VCO may shift to a higher or a lower range. Accordingly, an initial calibration may be necessary for each wideband segmented VCO to precisely determine a frequency spanning range of each segment in the VCO such that the VCO will not cause PLL lock interruption at various operation temperatures.

Embodiment 1

Figure 4:
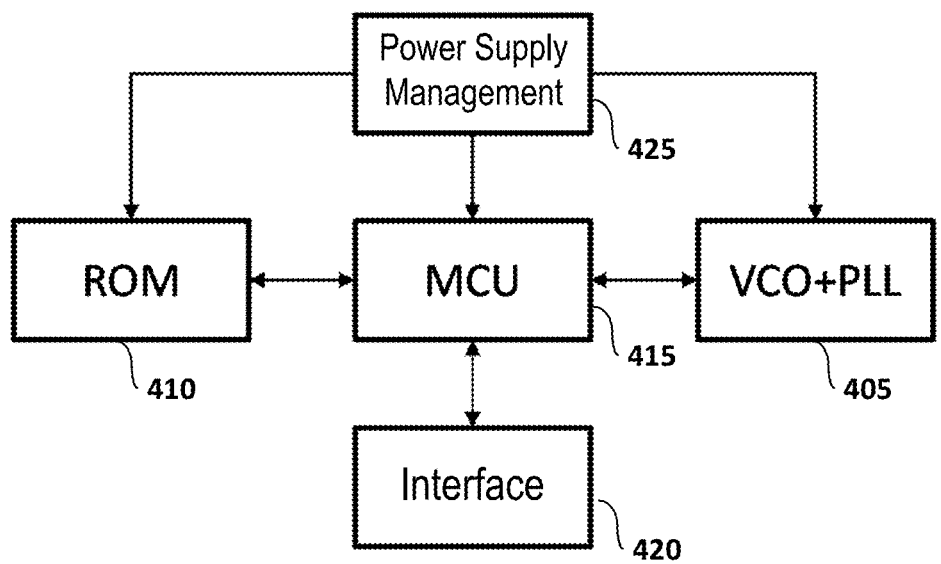
FIG. 4 depicts a block diagram to calibrate a wideband segmented VCO according to various embodiment of the invention.

FIG. 4 depicts a block diagram to calibrate a wideband segmented VCO according to various embodiment of the invention. The initial calibration may only need to be done one-time manually or automatically. Upon initial calibration, information of frequency spanning ranges of each segment in the VCO 405 may be saved into a non-volatile memory 410, e.g., a ROM, accessible by a microcontroller unit (MCU) 415. When the VCO is used or activated, the MCU reads data from the ROM and applied one or more VCO controls accordingly. The MCU couples to an interactive interface 420 such that a user may fetch the data stored in the ROM, or program the MCU for control update or debugging, etc. In one or more embodiments, a power source management module 425 couples to the ROM, MCU, and the VCO for power supply and management. In one or more embodiments, the ROM may be formed by electrically programmable fuse (eFUSE) and integrated together within the VCO. The eFUSE type ROM is programmed after a first calibration of the VCO.

Figure 5:
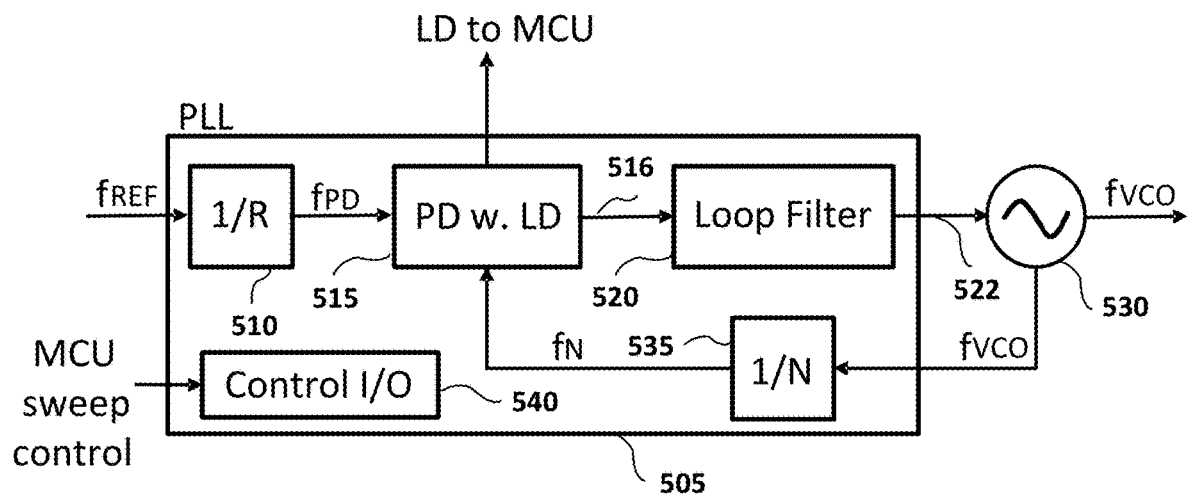
FIG. 5 depicts a schematic diagram to calibrate a wideband segmented VCO using PLL linear frequency sweep and lock detection according to various embodiment of the invention.

FIG. 5 depicts a schematic diagram to calibrate a wideband segmented VCO using PLL linear frequency sweep and lock detection (LD) according to various embodiment of the invention. Such a calibration may be done using a PLL circuit 505 in coupling with a wideband segmented VCO 530. The PLL circuit 505 comprises a first frequency divider (or an R counter) 510, a phase frequency detector 515, a loop filter 520, a second frequency divider (or an N counter) 535. The PLL circuit 505 may also comprise a control I/O module 540 to receive a MCU sweep control signal for segment selection. The first frequency divider 510 receives a reference signal $f_{REF}$ and outputs a phase detection signal $f_{PD}$ ($f_{PD}=f_{REF}/R$). The second frequency divider 535 receives an output signal $f_{VCO}$ from the VCO 530 and outputs a natural frequency signal $f_N$ ($f_N=f_{VCO}/N$). The phase frequency detector 515 detects a frequency/phase error between the phase detection signal $f_{PD}$ and the natural frequency signal $f_N$, and outputs a correction signal 516. In one or more embodiments, the phase frequency detector 515 may integrate a charge pump, which converts the frequency/phase error into a current for output. The loop filter 520, typically a low pass filter, receives the correction signal 516 from the phase frequency detector 515 and outputs a control voltage $V_t$ 522. The VCO 530 outputs the output signal $f_{VCO}$ based on the control voltage $V_t$ 522.

In one or more embodiments, a designed output frequency range of the wideband segmented VCO is known before the initial calibration. The MCU sweep control signal is configured to frequency sweep from a first initial frequency below a lower bound of the designed output frequency range and the control I/O module 540 selects a first segment, which outputs the lowest frequency band among all segments in the VCO, to start. In one or more embodiments, the first initial frequency may be chosen with a predetermined margin (e.g., 10% below the lower bound of the designed output frequency range) to ensure that the PLL is in an unlock status at the initial frequency. In one or more embodiments, during the PLL linear frequency sweep process, the MCU is consistently monitoring the lock/unlock status of the PLL through a lock detection (LD) signal generated from the phase frequency detector 515. The phase frequency detector 515 may record the lock detection signal to the MCU when a frequency/phase lock is engaged from an unlock status or a frequency/phase lock is interrupted from a lock status.

As frequency sweeping process goes to an actual lower frequency end of the first segment, the PLL starts to engage a frequency/phase lock and the phase frequency detector 515 sends such a LD signal (frequency/phase lock engaged) to the MCU such that the MCU may save the actual lower frequency end of the first segment into an ROM for data recording. As frequency sweeping process goes to an actual upper frequency end of the first segment, the PLL has a lock interruption and the phase frequency detector 515 sends such a LD signal (frequency/phase lock interrupted) to the MCU such that the MCU may save the actual upper frequency end of the first segment into an ROM for data recording.

Afterwards, the MCU sweep control signal is configured to frequency sweep from a second initial frequency below the actual upper frequency end of the first segment and the control I/O module 540 selects a second segment, which outputs the second lowest frequency band among all segments in the VCO, to start. In one or more embodiments, the second initial frequency may be choose with a predetermined margin (e.g., 5% below the lower bound of the designed output frequency range) to ensure that the PLL is in an unlock status at the second initial frequency for the second segment. As frequency sweeping process goes to an actual lower frequency end of the second segment, the PLL starts to engage a frequency/phase lock and the phase frequency detector 515 sends such a LD signal (frequency/phase lock engaged) to the MCU such that the MCU may save the actual lower frequency end of the second segment into an ROM for data recording. As frequency sweeping process goes to an actual upper frequency end of the second segment, the PLL has a lock interruption and the phase frequency detector 515 sends such a LD signal (frequency/phase lock interrupted) to the MCU such that the MCU may save the actual upper frequency end of the second segment into an ROM for data recording.

The above frequency sweeping process continues until the MCU may save the actual upper frequency end of the last segment into an ROM for data recording. During a frequency sweeping process for each segment, the frequency sweep step may be a predetermined linear step with balance of sweep precision and sweep efficiency.

One skilled in the art shall understand the frequency sweeping process may be implemented backward, e.g., sweeping from a frequency with a predetermined margin above the upper bound of the designed output frequency range. Such a backward frequency sweeping process shall still within the scope this disclosure.

Embodiment 2

Figure 6:
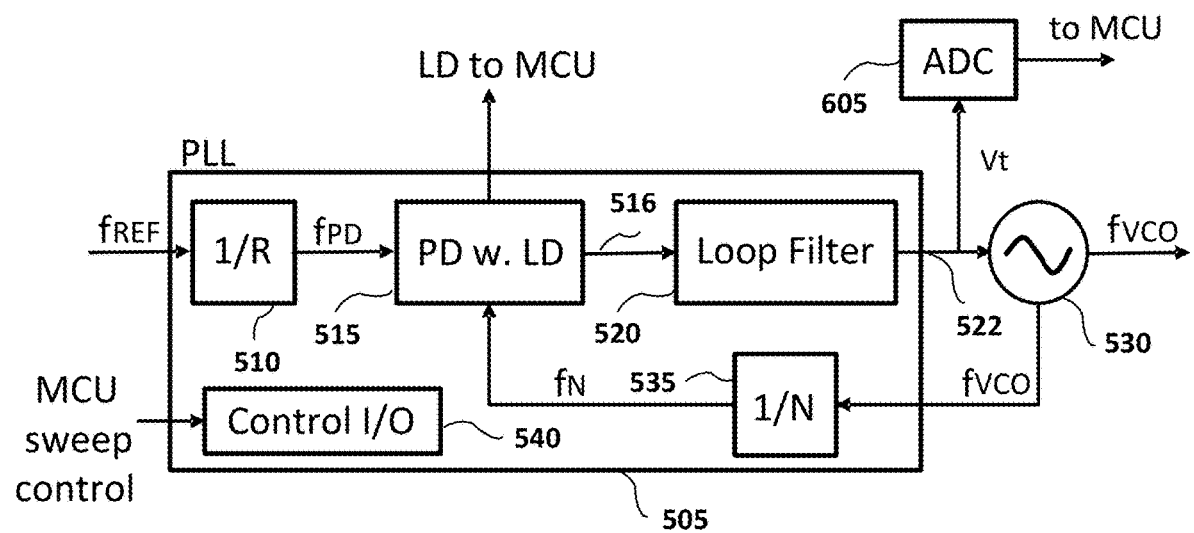
FIG. 6 depicts a schematic diagram to calibrate a wideband segmented VCO using PLL fast frequency sweep and lock indication according to various embodiment of the invention.

FIG. 6 is a schematic diagram to calibrate a wideband segmented VCO using PLL fast frequency sweep and lock indication according to various embodiment of the invention. Compared to the FIG. 5, an analog-to-digital converter (ADC) 605 is added in FIG. 6. The ADC couples to receive the control voltage $V_t$ 522, which outputs by the loop filter 520. In one or more embodiments, when the loop filter 520 is a passive loop, the range of the control voltage $V_t$ 522 is determined by an output voltage range of a charge pump integrated within the PLL; when the loop filter 520 is an active loop, the range of the control voltage $V_t$ 522 is determined by an output voltage range of active operational amplifier integrated within the loop filter.

In one or more embodiments, when MCU may be configured to change the frequency sweep step according to the value of the control voltage $V_t$ 522 to speed up the frequency sweep process without sacrificing precision in monitoring lock detection events. For example, assuming the control voltage $V_t$ 522 having a range of 0 to 5V, when the $V_t$ is below a first predetermined threshold (e.g., below 0.5V), the sweep step may be configured as a first value (e.g., 10 MHz), when the $V_t$ is between the first predetermined threshold and a second predetermined threshold (e.g., between 0.5V and 4.5V), the sweep step may be configured as a second value (e.g., 100 MHz) to speedup frequency sweeping, when the $V_t$ is above the second predetermined threshold (e.g., above 4.5V), the sweep step may be configured back to the first value (e.g., 10 MHz) less than the second value to increase sweep precision.

The linear frequency sweep as shown in FIG. 5 does not require an additional ADC for $V_t$ and further sweep control based on $V_t$ value. However, the linear frequency sweep may take a relatively long time and the precision may be compromised. On the other hand, the fast frequency sweep approach shown in FIG. 6 requires additional hardware and control logic, but may significantly reduce sweeping time with a combination of precise sweep and coarse sweep. A user may choose either one of the frequency sweeping methods accordingly for initial VCO calibration.

In one or more embodiments, an analog switch may be added before the ADC 605 to receive the Vt 522. The switch is turned on during VCO calibration, and turned off during normal VCO/PLL operation after calibration has been done. Noises may be introduced by the ADC 605 during normal VCO/PLL operation which may be blocked by the added switch.

Embodiment 3

Figure 7:
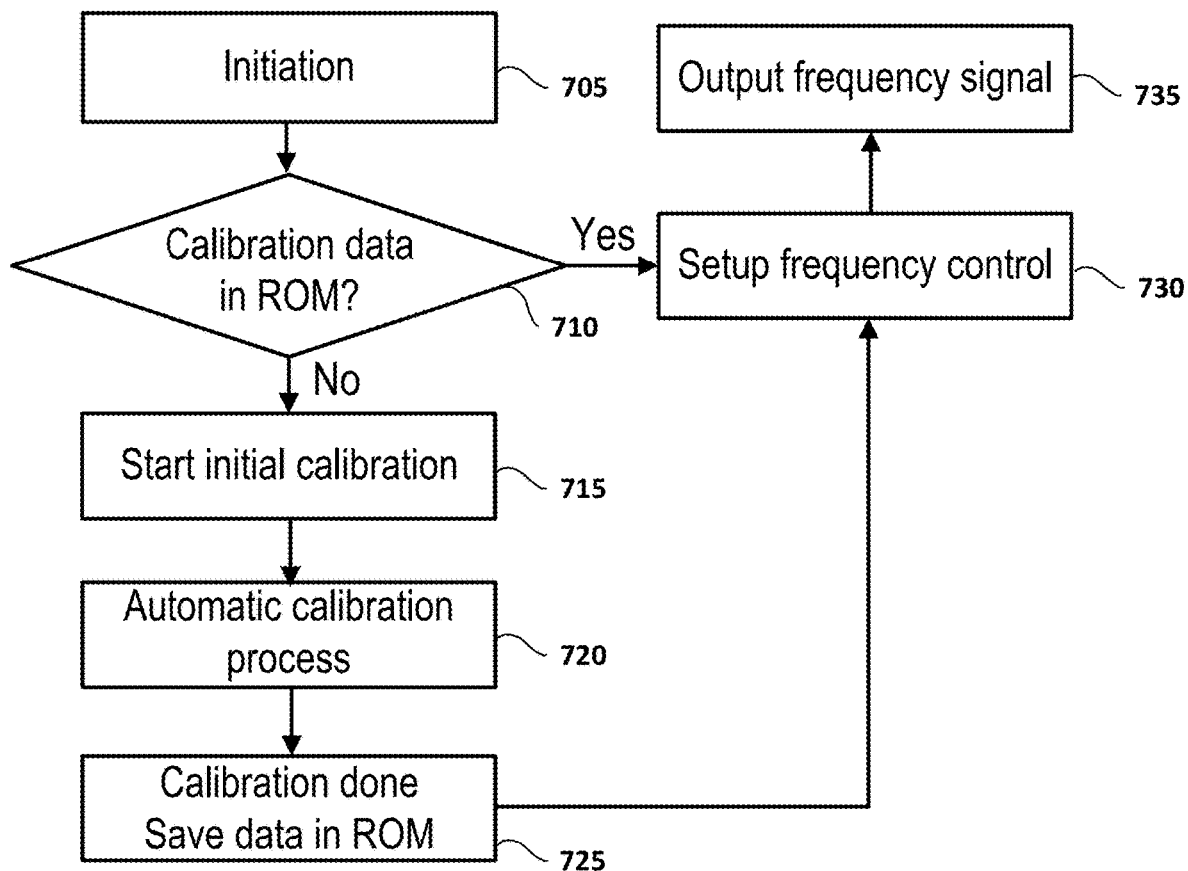
FIG. 7 depicts a process to calibrate a wideband segmented VCO according to various embodiment of the invention.

FIG. 7 is a process to calibrate a wideband segmented VCO according to various embodiment of the invention. The process starts from step 705 for initialization, wherein MCU requests a desired frequency signal from a segmented VCO. In step 710, the MCU verifies whether initial calibration data is saved in a memory (e.g., a ROM). If no, the process goes to step 715 to start initial calibration. In one or more embodiments, starting initial calibration comprises determining a designed frequency range for the VCO, control logic for segment selection, and a frequency sweep step value, etc. The frequency sweep step value may be a constant value for linear sweep or a variable value for fast sweep. After initial calibration started, the process goes to step 720 for automatic initial calibration during which a precise range for each segment is determined. When the automatic calibration is finished, initial calibration data is saved into the memory in step 725. Afterwards, one or more frequency control parameters (e.g., a desired segment, control voltage Vt, etc.) are set in step 730 based on the calibration data and the desired frequency signal. In response to a "Yes" for step 710, the process goes directly to step 730, without needing further calibration to avoid process delay. With the one or more frequency control parameters set, the segmented VCO operates to output the desired frequency signal in step 735.

In one or more embodiments, the step 715 to start initial calibration may be triggered externally. Such external triggering may be applicable for a scenario where a segmented VCO is found to be faulty and needs to be replaced. After a new segmented VCO installed, the memory in the VCO application circuit still store the calibration data for the "old" segmented VCO. If the MCU sets frequency control for the new segmented VCO using the "old" calibration data, an error may occur. Therefore, an initial calibration needs to be triggered externally even though there are calibration data in the memory.

In one or more embodiments, the step 710 of initial calibration data verification may further comprise a verification of VCO serial number. If the segmented VCO in the application circuit has a serial number matching a record of the VCO serial number in the memory (and initial calibration data available in the memory), the process goes directly to step 735. Such an additional VCO serial number verification may provide an alternative calibration process.

Assuming a wideband segmented VCO (comprising N segments) having a designed output frequency range between a minimum frequency (Fmin) and a maximum frequency (Fmax), adjacent segments have enough frequency overlap (e.g., >5% relative bandwidth). In one or more embodiments, frequency sweep for the first segment may start, with a sweep step of df1, from Fmin×(1−D1), where D1 is a coefficient, e.g., 10%, to ensure that the PLL is not able to lock at the frequency of Fmin×(1−D1). The frequency at which the PLL transits into a lock state from an unlock status is a lower frequency end($F_{1L}$) of actual first band corresponding to the first segment of VCO. The $F_{1L}$ shall meet the condition of Fmin≥$F_{1L}$(1+Tc1), where Tc1 is a first predetermined temperature coefficient, e.g., 1%, to ensure that the condition Fmin≥$F_{1L}$ holds in any VCO operation temperature. The frequency sweep process continues until the PLL transits into an unlock status (from a lock status), which corresponds to a frequency end for the first segment. The frequency of last lockable frequency sweep step before the unlock status is an upper frequency end ($F_{1H}$) of actual first band corresponding to the first segment of VCO.

Afterwards, frequency sweep for the second segment may start, with a sweep step of df2, from $F_{1H}$×(1−D2), where D2 is a coefficient, e.g., 12%, to ensure that the PLL is not able to lock at the frequency of $F_{1H}$×(1−D2). The sweep step df2 may or may not be the same as df1. The frequency at which the PLL transits into a lock state from an unlock status is a lower frequency end ($F_{2L}$) of actual second band corresponding to the second segment of VCO. The frequency sweep process continues until the PLL transits into an unlock status (from a lock status), which corresponds to a frequency end for the second segment. The frequency of last lockable frequency sweep step before the unlock status is an upper frequency end ($F_{2H}$) of actual second band corresponding to the second segment of VCO.

The process continues to the $N^{th}$ segment (the last segment of the VCO), with a sweep step of dfn, from $F_{(n-1)H}$×(1−Dn), where Dn is a coefficient, e.g., 10%, to ensure that the PLL is not able to lock at the frequency of $F_{(n-1)H}$×(1−Dn). The frequency at which the PLL transits into a lock state from an unlock status is a lower frequency end ($F_{nL}$) of actual $N^{th}$ band corresponding to the $N^{th}$ segment of VCO. The frequency sweep process continues until the PLL transits into an unlock status (from a lock status), which corresponds to a frequency end for the $N^{th}$ segment. The frequency of last lockable frequency sweep step before the unlock status is an upper frequency end ($F_{nH}$) of actual $N^{th}$ band corresponding to the $N^{th}$ segment of VCO. The $F_{nH}$ shall meet the condition of Fmax≤$F_{nH}$(1−Tc2), where Tc2 is a second predetermined temperature coefficient, e.g., 1%, to ensure that the condition Fmax≤$F_{nH}$ holds in any VCO operation temperature. Tc2 may or may not be the same as Tc1.

In one or more embodiments, a frequency overlap ratio between two adjacent segments, e.g., the first segment and the second segment, may be defined as $2(F_{1H}-F_{2L})/(F_{1H}+F_{2L})$.

In one or more embodiments, to ensure that each segment that the MCU selects may reliably output a frequency signal within its designated frequency band under different operation temperatures, the lower frequency end and upper frequency end of the frequency range for each frequency band may need to be adjusted for temperature compensation, such that the adjusted frequency band for each segment is valid for any VCO operation temperature. An example of adjustment may be shown below:

$$F_{1L}'=F_{1L}\times(1+KL1), F_{1H}'=F_{1H}\times(1-KH1)$$

$$F_{2L}'=F_{2L}\times(1+KL2), F_{2H}'=F_{2H}\times(1-KH2)$$

$$\ldots$$

$$F_{nL}'=F_{nL}\times(1+KLn), F_{nH}'=F_{nH}\times(1-KHn)$$

Where KL1, KL2, . . . , KLn, KH1, KH2, . . . , KHn are adjustment coefficients, which may or may not be the same. After adjustment, the frequency range of the adjusted frequency band for each segment becomes less than the frequency range before adjustment. Any adjacent adjusted frequency band may still need to have frequency overlap for the adjusted frequency ranges to ensure no gap in frequency coverage between adjacent adjusted frequency bands. Conditions of Fmin≥$F_{1L}'$, and Fmax≤$F_{nH}'$ need to hold to ensure that the VCO covers designed output frequency range between a minimum frequency (Fmin) and a maximum frequency (Fmax).

In one or more embodiments, after adjustment, the lower frequency end and the upper frequency end for each adjusted frequency band are saved into a ROM, as shown in Table 1 below.

TABLE 1

Frequency range for each adjusted frequency band

| Adjusted frequency band | Lower frequency end | Upper frequency end |
| --- | --- | --- |
| 1 | $F_{1L}'$ | $F_{1H}'$ |
| 2 | $F_{2L}'$ | $F_{2H}'$ |
| 3 | $F_{3L}'$ | $F_{3H}'$ |
| ... | ... | ... |
| N | $F_{nL}'$ | $F_{nH}'$ |

Figure 8:
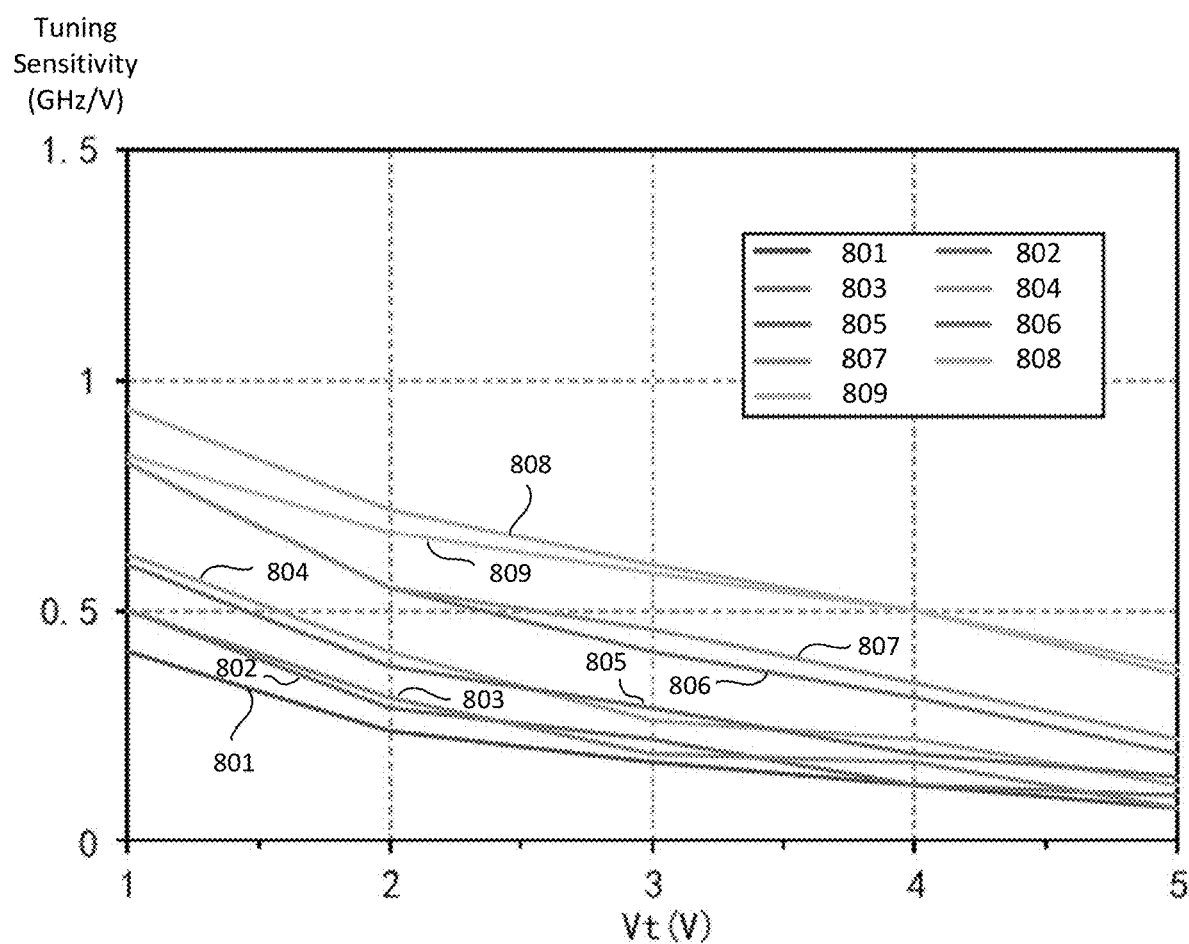
FIG. 8 depicts tuning sensitivities of multiple segments in a segmented VCO under different control voltage according to various embodiment of the invention.

In one or more embodiments, a segmented VCO may be locked in a PLL to operate in a segment. In a PLL circuit, a VCO may be configured to have different tuning sensitivity Kv under different control voltage Vt. Typically, a VCO may have higher Kv when the control voltage Vt is relatively low and have lower Kv when the control voltage Vt is relatively high. For optimum PLL loop phase noise, the product (Kv×Icp) of tuning sensitivity Kv and charge pump current Icp is desired to be a constant or relatively constant value such that the loop bandwidth of the PLL may be constant under different output frequency. Accordingly, when the tuning sensitivity Kv is relatively high, a low charge pump current Icp is preferred; when the tuning sensitivity Kv is relatively low, a high charge pump current Icp is preferred. Typically, when the tuning sensitivity Kv is relatively low, the PLL has a low overall loop phase noise. Therefore, in the frequency overlap zone of two adjacent segments, it is desirable to associate the frequency overlap zone to the segment having a lower tuning sensitivity Kv (the segment corresponding to a higher control voltage Vt). Afterwards, a final frequency band for each segment may be established. FIG. 8 depicts tuning sensitivities of multiple segments 801~809 in a VCO under different control voltage according to various embodiment of the invention. As shown in FIG. 8, the tuning sensitivity for each segment is getting lower when the control voltage Vt increases.

In one or more embodiments, the adjusted frequency band of a segment in a segmented VCO may be segmented further into multiple sub-bands. Each sub-band may be assigned to a corresponding charge pump current Icp for fine tuning with improved PLL loop phase noise performance. The assigned charge pump current values of the sub-bands may be saved to the ROM such that the MCU may fetch one or more parameters when a segment is selected for operation. In one or more embodiments, the one or more parameters comprise a number for a selected segment, a number for a selected sub-band within the selected segment, and a charge pump current value for the selected sub-band. In an example, an $x^{th}$ segment of a segmented VCO has a bandwidth (BWx) expressed as BWx=$F_{xH}'-F_{xL}'$. The $x^{th}$ segment is further segmented into M sub-bands. Each sub-band may be associated with a charge pump current Icp, as shown in Table 2 below.

TABLE 2

Sub-bands within a VCO segment and associated charge pump current

| Lower frequency end of a sub-band | Upper frequency end of a sub-band | Icp |
| --- | --- | --- |
| $F_{xL}'$ | $F_{xL}'$ + $BW_x$/M | $I_{cpx1}$ |
| $F_{xL}'$ + $BW_x$/M | $F_{xL}'$ + 2 × $BW_x$/M | $I_{cpx2}$ |
| $F_{xL}'$ + 2 × $BW_x$/M | $F_{xL}'$ + 3 × $BW_x$/M | $I_{cpx3}$ |
| ... | ... | ... |
| $F_{xL}'$ + (M − 1) × $BW_x$/M | $F_{xL}'$ + $BW_x$ | $I_{cpxm}$ |

In one or more embodiments, when a VCO output with a specific frequency is desired, the MCU selects a corresponding segment according to the aforementioned adjusted frequency band for each segment. In one or more embodiments, when the specific frequency is within a frequency overlap zone of two adjacent segments, the MCU selects one segment, between the two adjacent segments, having a lower tuning sensitivity Kv corresponding to the specific frequency such that there is only one final selection of segment for the specific frequency. Table 3 below shows an exemplary final frequency range for different bands (or segments), in this example the VCO tuning sensitivity Kv for each segment is getting lower when the control voltage Vt increases.

TABLE 3

Final frequency range corresponding to various bands

| Final Frequency Range | Bands |
|---|---|
| [$F_{1L}'$, $F_{1H}'$] | 1 |
| ($F_{1H}'$, $F_{2H}'$] | 2 |
| ($F_{2H}'$, $F_{3H}'$] | 3 |
| ... | ... |
| ($F_{(n-1)H}'$, $F_{nH}'$] | N |

In one or more embodiments, upon selection of a band (a segment), the MCU further selects a corresponding sub-band (or a sub-segment) within the selected segment according to the aforementioned sub-band disclosure (e.g., Table 2) and applies a charge pump current associated with the selected corresponding sub-band for desirable loop phase noise performance.

In one or more embodiments, a final frequency band (after frequency overlap association) instead of the adjusted frequency band of a segment in a segmented VCO is segmented into multiple sub-bands with a charge pump current Icp associated with each sub-band of the final frequency band. Alternatively, a calibrated frequency band (before temperature compensation) instead of the adjusted frequency band of a segment in a segmented VCO is segmented into multiple sub-bands with a charge pump current Icp associated with each sub-band of the calibrated frequency band. One skilled in art shall understand that such variations are within the scope of the present disclosure.

Described herein is an exemplary segmented VCO having 3 segments. The VCO has a designed output frequency range of [Fmin, Fmax] as [13.5 GHz, 20 GHz]. Upon calibration, the 3 segments have corresponding adjusted frequency bands shown in Table 4 below.

TABLE 4

Adjusted frequency bands for exemplary VCO segments after calibration

| Adjusted Frequency Band | Lower frequency end | Upper frequency end |
|---|---|---|
| 1 | $F_{1L}'$ = 13.2 GHz | $F_{1H}'$ = 15.5 GHz |
| 2 | $F_{2L}'$ = 14.9 GHz | $F_{2H}'$ = 18.3 GHz |
| 3 | $F_{3L}'$ = 17 GHz | $F_{3H}'$ = 20.4 GHz |

Figure 9:
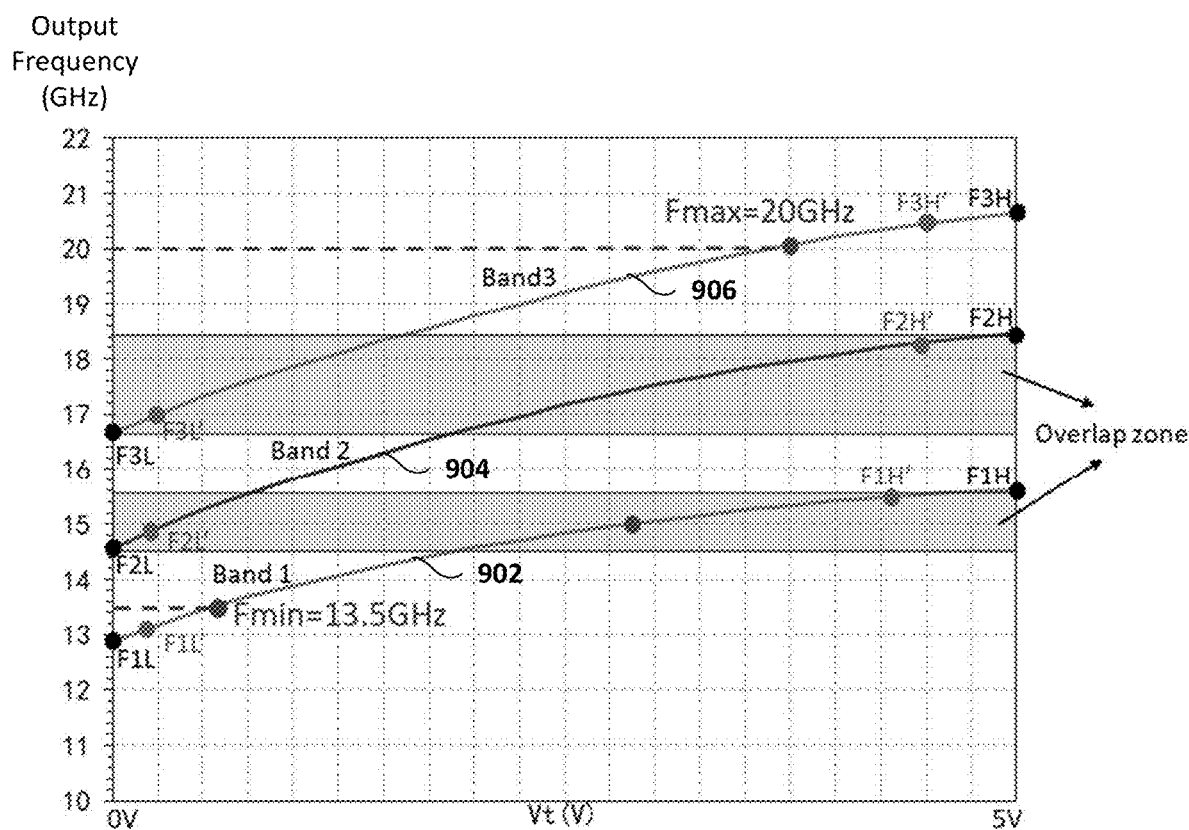
FIG. 9 depicts an exemplary of calibrated frequency bands for a segmented VCO according to various embodiment of the invention.

As shown in Table 4, the conditions Fmin>$F_{1L}'$ and Fmax<$F_{3H}'$ are met. When a VCO output with a specific frequency is desired, an MCU selects to associate a corresponding segment according to the aforementioned adjusted frequency band for each segment. In one or more embodiments, when the specific frequency, e.g., 15 GHz, is within a frequency overlap zone of two adjacent segments (e.g., segment 1 and segment 2), the MCU selects one segment, e.g., segment 1, between the two adjacent segments, because segment 1 has a lower tuning sensitivity Kv (corresponding to a higher control voltage Vt) for 15 GHz. Table 5 below shows an exemplary final frequency range for different bands (or segments). FIG. 9 depicts the exemplary of calibrated frequency bands 902, 904, and 906.

TABLE 5

Final frequency ranges for exemplary VCO segments

| Frequency Band | Final frequency ranges |
|---|---|
| 1 | [13.2 GHz, 15.5 GHz] |
| 2 | (15.5 GHz, 18.3 GHz] |
| 3 | (18.3 GHz, 20.4 GHz] |

Upon selecting to associate band 1, the MCU selects a sub-band within the band 1 to which the 15 GHz belongs to and applies a corresponding Icp to the PLL circuit.

The foregoing description of the invention has been described for purposes of clarity and understanding. It is not intended to limit the invention to the precise form disclosed. Various modifications may be possible within the scope and equivalence of the appended claims.

It will be appreciated to those skilled in the art that the preceding examples and embodiments are exemplary and not limiting to the scope of the present invention. It is intended that all permutations, enhancements, equivalents, combinations, and improvements thereto that are apparent to those skilled in the art upon a reading of the specification and a study of the drawings are included within the true spirit and scope of the present invention.

It shall also be noted that elements of the claims may be arranged differently including having multiple dependencies, configurations, and combinations. For example, in embodiments, the subject matter of various claims may be combined with other claims.

The invention claimed is:

1. A method to calibrate a segmented voltage controlled oscillator (VCO) that has multiple segments, the method comprising:
   a step of receiving a request for a VCO output with a desired frequency;
   a step of verifying whether initial calibration data are available in a memory;
   responsive to initial calibration data being available in the memory, a step of fetching one or more frequency control parameters, based on the request, from the initial calibration data, and operating the segmented VCO using the fetched one or more frequency control parameters;
   responsive to initial calibration data being unavailable in the memory, a step of operating the segmented VCO using one or more parameters established after implementing an initial calibration process, the initial calibration process comprising:
      a step of giving a designed output frequency range between a minimum frequency and a maximum frequency for the segmented VCO, implementing a frequency sweep, using a phase lock loop (PLL) coupled to the segmented VCO, for each segment among the multiple segments; and
      a step of identifying a lower frequency end and an upper frequency end of an actual frequency band for each segment when the PLL transits into a lock state from an unlock status or transits into an unlock state from a lock status.

2. The method of claim 1 wherein the initial calibration process further comprising:
   a step of implementing an adjustment as temperature compensation for the actual frequency band for each segment to obtain an adjusted frequency band for each segment.

3. The method of claim 2 wherein the initial calibration process further comprising:
  responsive to any two adjacent segments having a frequency overlap within the adjusted frequency bands, a step of associating the frequency overlap zone to a segment, between the two adjacent segments, with a lower tuning sensitivity; and
  establishing a final frequency band for each segment.

4. The method of claim 2 wherein the initial calibration process further comprising:
  a step of segmenting each adjusted frequency band into multiple sub-bands;
  a step of assigning a charge pump current value for each sub-band;
  a step of saving the multiple sub-bands and the assigned charge pump current value for each sub-band into the memory.

5. The method of claim 3 wherein the initial calibration process further comprising:
  a step of ensuring that a first segment with the lowest final frequency band among the multiple segments has a lower frequency end less than the minimum frequency; and
  a step of ensuring that a last segment with the highest final frequency band among the multiple segments has an upper frequency end higher than the maximum frequency.

6. The method of claim 4 wherein the one or more parameters established after implementing the initial calibration process comprise a number for a selected segment for the desired frequency, a number for a selected sub-band within the selected segment for the desired frequency, and a charge pump current value for the selected sub-band.

7. The method of claim 1 wherein the initial calibration process starts from a frequency below the minimum frequency such that the PLL is in an unlocked status initially.

8. A method to calibrate a segmented voltage controlled oscillator (VCO) that has multiple segments, the segmented VCO has a designed output frequency range between a minimum frequency and a maximum frequency, the method comprising:
  a step of initiating a frequency sweep, using a phase lock loop (PLL) coupled to the segmented VCO, for a first segment among the multiple segments, the first segment has a lowest designed frequency band among the multiple segments; and
  a step of identifying a lower frequency end of an actual frequency band for the first segment when the PLL transits into a lock state from an unlock status and ensuring that the lower frequency end of the actual frequency band for the first segment is lower than the minimum frequency;
  a step of identifying an upper frequency end of the actual frequency band for the first segment when the PLL transits an upper frequency end or transits into an unlock state from a lock status;
  a step of iteratively repeating the frequency sweep for other segments until the last segment with a lower frequency end and an upper frequency end of an actual frequency band being identified, the last segment has the highest designed frequency band among the multiple segments; and
  a step of ensuring that the upper frequency end of the actual frequency band for the last segment is higher than the maximum frequency.

9. The method of claim 8 further comprising:
  a step of implementing an adjustment as temperature compensation for the actual frequency band for each segment to obtain an adjusted frequency band for each segment.

10. The method of claim 9 further comprising:
  responsive to any two adjacent segments having a frequency overlap within the adjusted frequency bands, a step of associating the frequency overlap zone to a segment, between the two adjacent segments, with a lower tuning sensitivity; and
  a step of establishing a final frequency band for each segment.

11. The method of claim 9 further comprising:
  a step of segmenting each adjusted frequency band into multiple sub-bands;
  a step of assigning a charge pump current value for each sub-band;
  a step of saving the multiple sub-bands and the assigned charge pump current value for each sub-band into a memory.

12. The method of claim 8 wherein the frequency sweep starts from a frequency below the minimum frequency such that the PLL is in an unlocked status initially.

13. A system comprising:
  a segmented voltage controlled oscillator (VCO) that has multiple segments, the segmented VCO has a designed output frequency range between a minimum frequency and a maximum frequency;
  a phase lock loop (PLL) coupled to receive an output from the segmented VCO and generate a control voltage to control the segmented VCO;
  a non-volatile memory for information storage;
  a microcontroller unit (MCU) coupled to the segmented VCO and the PLL, the MCU is configured for:
    upon receiving a request for a desired VCO output having a desired frequency, verifying whether initial calibration data are available in the non-volatile memory;
    responsive to initial calibration data being available in the non-volatile memory, fetching one or more frequency control parameters, based on the request, from the initial calibration data, and operating the VCO using the fetched one or more frequency control parameters;
    responsive to initial calibration data being unavailable in the non-volatile memory, operating the VCO using one or more parameters established after implementing an initial calibration process, the initial calibration process comprising:
      implementing a frequency sweep, using the PLL, for each segment among the multiple segments; and
      identifying a lower frequency end and an upper frequency end of an actual frequency band for each segment when the PLL transits into a lock state from an unlock status or transits into an unlock state from a lock status.

14. The system of claim 13 wherein the MCU is further configured for:
  implementing an adjustment as temperature compensation for the actual frequency band for each segment to obtain an adjusted frequency band for each segment.

15. The system of claim 14 wherein the MCU is further configured for:
  responsive to any two adjacent segments having a frequency overlap within the adjusted frequency bands, associating the frequency overlap zone to a segment, between the two adjacent segments, with a lower tuning sensitivity; and establishing a final frequency band for each segment.

16. The system of claim 14 wherein the MCU is further configured for:

segmenting each adjusted frequency band into multiple sub-bands;

assigning a charge pump current value for each sub-band;

saving the multiple sub-bands and the assigned charge pump current value for each sub-band into the non-volatile memory.

17. The system of claim 16 wherein the one or more parameters established after implementing the initial calibration process comprise a number for a selected segment for the desired frequency, a number for a selected sub-band within the selected segment for the desired frequency, and a charge pump current value for the selected sub-band.

18. The system of claim 15 wherein the MCU is further configured for:

ensuring that a first segment with the lowest final frequency band among the multiple segments has a lower frequency end less than the minimum frequency; and ensuring that a last segment with the highest final frequency band among the multiple segments has an upper frequency end higher than the maximum frequency.

19. The system of claim 13 wherein the frequency sweep for each segment starts from a frequency below a lower frequency end of the designed frequency band for the each segment such that the PLL is in an unlocked status initially for the each segment.

20. The system of claim 13 further comprises an analog-to-digital converter (ADC) to perform the frequency sweep, with a variable frequency sweep step for each segment among the multiple segments.

* * * * *